(12) United States Patent
Shankar

(10) Patent No.: US 10,931,240 B2
(45) Date of Patent: Feb. 23, 2021

(54) AMPLIFIER WITH REDUCED POWER CONSUMPTION AND IMPROVED SLEW RATE

(71) Applicant: Analog Devices International Unlimited Company, Limerick (IE)

(72) Inventor: Asit Shankar, Murphy, TX (US)

(73) Assignee: Analog Devices International Unlimited Company, Limerick (IE)

( * ) Notice: Subject to any disclaimer, the term of this patent is extended or adjusted under 35 U.S.C. 154(b) by 35 days.

(21) Appl. No.: 16/389,435

(22) Filed: Apr. 19, 2019

(65) Prior Publication Data
US 2020/0228066 A1    Jul. 16, 2020

Related U.S. Application Data

(60) Provisional application No. 62/791,268, filed on Jan. 11, 2019.

(51) Int. Cl.
 *H03F 1/22* (2006.01)
 *H03F 3/45* (2006.01)
 *H03F 1/02* (2006.01)

(52) U.S. Cl.
 CPC ............. *H03F 1/22* (2013.01); *H03F 1/0211* (2013.01); *H03F 3/4508* (2013.01);
 (Continued)

(58) Field of Classification Search
 CPC .......................................................... H03F 1/22
 See application file for complete search history.

(56) References Cited

U.S. PATENT DOCUMENTS

| | | | |
|---|---|---|---|
| 5,604,464 A | * | 2/1997 | Hwang ............... H03F 3/45188 330/253 |
| 6,359,512 B1 | | 3/2002 | Ivanov et al. |

(Continued)

FOREIGN PATENT DOCUMENTS

| | | |
|---|---|---|
| CN | 103326673 B | 3/2016 |
| CN | 107947747 A | 4/2018 |

OTHER PUBLICATIONS

Assaad, Rida, et al., "The Recycling Folded Cascode: A General Enhancement of the Folded Cascode Amplifier", IEEE Journal of Solid-State Circuits, vol. 44, No. 9, (Sep. 2009), 8 pgs.

(Continued)

*Primary Examiner* — Patricia T Nguyen
(74) *Attorney, Agent, or Firm* — Schwegman Lundberg & Woessner, P.A.

(57) ABSTRACT

An amplifier circuit can be configured to receive a differential input signal having a common mode component that can extend to at least one power supply rail for the amplifier circuit. The amplifier circuit can include an input stage, such as having a first differential transistor pair, and the input stage can receive the differential input signal and in response conduct a differential first current to a cascode output stage. The cascode output stage can include or use a cascode control signal that is adjusted in response to the differential input signal. The cascode control signal can be independent of a transconductance of the first differential transistor pair. In an example, the amplifier circuit includes a slew boost circuit configured to source or sink current at an output of the amplifier based on a magnitude and polarity of the differential input signal.

20 Claims, 3 Drawing Sheets

(52) U.S. Cl.
CPC .............. *H03F 2203/45028* (2013.01); *H03F 2203/45056* (2013.01); *H03F 2203/45124* (2013.01); *H03F 2203/45178* (2013.01); *H03F 2203/45248* (2013.01)

(56) References Cited

U.S. PATENT DOCUMENTS

| | | | |
|---|---|---|---|
| 6,392,485 | B1 | 5/2002 | Doi et al. |
| 6,628,168 | B2 | 9/2003 | Martin et al. |
| 6,642,788 | B1 * | 11/2003 | Abughazaleh ...... H03F 3/45219 330/136 |
| 6,822,513 | B1 | 11/2004 | Li et al. |
| 7,342,450 | B2 | 3/2008 | Jones |
| 7,375,585 | B2 | 5/2008 | Trifonov et al. |
| 7,443,237 | B1 | 10/2008 | Liu |
| 7,652,538 | B2 | 1/2010 | Choi |
| 7,663,439 | B2 | 2/2010 | Chang |
| 7,768,351 | B2 | 8/2010 | Ivanov et al. |
| 7,884,671 | B2 | 2/2011 | Chung |
| 8,390,379 | B2 | 3/2013 | Snoeij et al. |
| 9,692,374 | B2 | 6/2017 | Saeki |
| 10,326,418 | B2 * | 6/2019 | Ramorini ............ H03F 3/45771 |
| 2008/0180174 | A1 | 7/2008 | Kim et al. |
| 2013/0127537 | A1 * | 5/2013 | Nandy ................ H03F 3/45071 330/261 |
| 2019/0363675 | A1 * | 11/2019 | Banu ....................... H03K 5/00 |

OTHER PUBLICATIONS

Hogervorst, Ron, et al., "A Compact Power-Efficient 3 V CMOS Rail-to-Rail Input/Output Operational Amplifier for VLSI Cell Libraries", IEEE Journal of Solid-State Circuits, vol. 29, No. 12, (Dec. 1994), 9 pgs.

Sarkar, Arnab, et al., "Design of a Power Efficient, High Slew Rate and Gain Boosted Improved Recycling Folded Cascode Amplifier with Adaptive Biasing Technique", Microsystem Technologies, vol. 23, Issue 9, (Sep. 2017), 4255-4262.

Valero, M.R., et al., "Slew rate enhancement based on use of squaring circuits", Electronics Letters, vol. 51, No. 3, (Feb. 5, 2015), 2 pgs.

* cited by examiner

AMPLIFIER WITH REDUCED POWER CONSUMPTION AND IMPROVED SLEW RATE

CLAIM OF PRIORITY

This patent application claims the benefit of priority to U.S. Provisional Patent Application No. 62/791,268, filed on Jan. 11, 2019, which is incorporated by reference herein in its entirety.

BACKGROUND

A cascode amplifier generally includes a two-stage circuit with a common-emitter stage that feeds a common-base stage. A folded cascode amplifier can include or use a cascode topology with an input common-mode level that is near a power supply or rail voltage. In an example, a folded cascode differential amplifier can be used as an opamp input stage in bipolar and CMOS designs. In some examples, a cascode topology can be used with amplifiers that may accommodate input signals that can swing all the way to one of the amplifier's power supply rails, however current starvation and circuit stability issues can remain in such an approach.

OVERVIEW

FIG. 1 illustrates generally an example of an approach to a folded cascode input stage for an amplifier as implemented in a bipolar process. In the approach shown in FIG. 1, the emitters of the cascode transistors $Q_0$ and $Q_3$ can be connected to resistors $R_0$ and $R_1$, respectively, such as instead of being connected to active current sources, to help reduce input-referred voltage noise. In the example of FIG. 1, an input differential pair comprises transistors $Q_1$ and $Q_2$ that are coupled to a current source $I_0$. The current source $I_0$ provides a maximum tail current magnitude of 2I for the differential pair of $Q_1$ and $Q_2$.

In FIG. 1, quiescent currents in the cascode transistors $Q_0$ and $Q_3$ are respectively generally greater than 1I, and a maximum current in each of resistors $R_0$ and $R_1$ can respectively be greater than 2I. If inadequate current is available from the current source $I_0$ or if $R_0$ and $R_1$ are not sufficiently configured to carry a current magnitude of greater than 2I, then the current in cascode transistors $Q_0$ or $Q_3$ can become zero during conditions of "full tilt," that is, when a differential input voltage across the input pair $Q_1$ and $Q_2$ is greater than ~$3V_T$ (where $V_T$=kT/q, or around 25.7 mV at room temperature). If a current in $Q_0$ or $Q_3$ is zero, then amplifier stability issues arise, such as when recovering from an input overload condition.

For example, if $v_{ip} \gg v_{im}$, then 2I flows through $Q_2$ of the differential input pair. If the current in resistor $R_1$ is limited to 2I, then the current in $Q_3$ can go to zero. If no current passes through $Q_3$, then recovery issues can arise when the input differential voltage (e.g., Vin=$v_{ip}$-$v_{im}$) returns to or approaches zero. This illustrates that a current consumption of the folded cascode input stage in FIG. 1 can include at least 2I from the current source $I_0$, plus at least 1I for respective quiescent currents in the cascode transistors $Q_0$ and $Q_3$, for a total current consumption of greater than 4I. Furthermore, a slew rate of an amplifier using the topology of FIG. 1 is 2I/$C_C$, where $C_C$ is the capacitance of the Miller compensation capacitor, or of a load capacitor $C_1$ at the output of the folded cascode stage. When the cascode input stage is used in an operational amplifier, the amplifier's slew rate is thus at most Isupply_fc/(2$C_C$), where Isupply_fc is the total current consumption of the input stage.

Various issues are thus associated with a folded cascode input stage for an operational amplifier. For example, the amplifier can have a quiescent current requirement greater than 4I, where 2I is a magnitude of a tail current source of the input differential pair. This relatively large current supply requirement can be problematic when it is desired to increase or maximize performance and reduce or minimize power consumption, for example because slew rate and input-referred voltage noise generally worsen as power consumption is reduced.

Various techniques can be used to enhance slew rate. For example, a tail current source magnitude can be increased. However, this increases transconductance of the input pair, which can compromise stability. For example, an increase in tail current from the source $I_0$ in FIG. 1 is accompanied by an increase in the input quiescent current of transistors $Q_0$ and $Q_3$, which in turn corresponds to an increase in a voltage drop across resistors $R_0$ and $R_1$. This increase in voltage drop can reduce an input range of the amplifier during input overload conditions because the collector voltage of one of the transistors of the input pair increases, resulting in saturation and hence phase reversal for inputs voltages that are close to the negative supply voltage.

The present inventor has recognized, among other things, that a problem to be solved can include providing an amplifier input stage with reduced current consumption relative to previous approaches using a folded cascode-protected output. In an example, the problem can include avoiding current starvation and stability issues during large input signal swings or tilt. In an example, the problem can further include enhancing a magnitude of an available output current from the input stage without increasing a transconductance of the input stage and without increasing noise. In an example, the problem can further include providing an input stage with enhanced slew characteristics.

In an example, a solution to the above-described problems includes an amplifier input stage that is configured to sense a magnitude and polarity of a differential input signal and, in response, update a current consumption of a cascode output stage, and update a current supplement at an output node such as to help enhance slew performance of the amplifier input stage.

In an example, the solution can include a cascode amplifier with an input stage including a first differential transistor pair and a cascode output stage including a cascode control signal that is dynamically adjusted in response to the differential input signal sensed at the input nodes of the first differential transistor pair. In an example, the cascode control signal is determined separately or substantially independently from a transconductance characteristic of the first differential transistor pair. In an example, the solution further includes a slew boost circuit configured to source or sink current at an output node of the amplifier based on a magnitude and polarity of the differential input signal at the input nodes.

In an example, the solution further includes a bias stage configured to provide the cascode control signal. The bias stage can include second and third differential transistor pairs configured to receive the same differential input signal from the input nodes of the first differential transistor pair. At least one of the transistors of each of the second and third differential transistor pairs has a different device area characteristic than the other transistor in the respective pair. The cascode control signal is determined using transistors from the second and third differential transistor pairs, respectively having lesser device area characteristics, and the slew boost circuit is coupled to other ones of the transistors from the second and third differential transistor pairs, respectively having greater device area characteristics.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document describes, among other things, an amplifier circuit that can be configured to receive a differential input signal having a common mode component that can extend to at least one power supply rail for the amplifier circuit. The amplifier circuit can include an input stage, such as having a first differential transistor pair, and the input stage can receive the differential input signal and in response conduct a differential first current to a cascode output stage. The cascode output stage can include or use a cascode control signal that is adjusted in response to the differential input signal. The cascode control signal can be independent of a transconductance of the first differential transistor pair. In an example, the amplifier circuit includes a slew boost circuit configured to source or sink current at an output of the amplifier based on a magnitude and polarity of the differential input signal.

In this document, a "supply-sensing amplifier circuit" is one configured to detect input signals at one of a positive or negative supply node or "rail" of the amplifier circuit itself. For an amplifier circuit with supply rails at Vcc and Vee, for example, a supply-sensing amplifier configuration will enable the amplifier to detect an input signal when the input signal has the same voltage value as one of Vcc (for positive supply-sensing), or Vee (for negative supply-sensing).

Common mode voltage range refers to a range of acceptable voltage signals at an input to an amplifier. For a differential amplifier, such as one that uses a differential transistor pair to sense a differential voltage signal at its inputs, as explained herein, the circuitry can be configured to ensure common mode operation that accommodates an input signal that has substantially the same magnitude as a signal on at least one of the supply rails of the amplifier.

Figure 1:
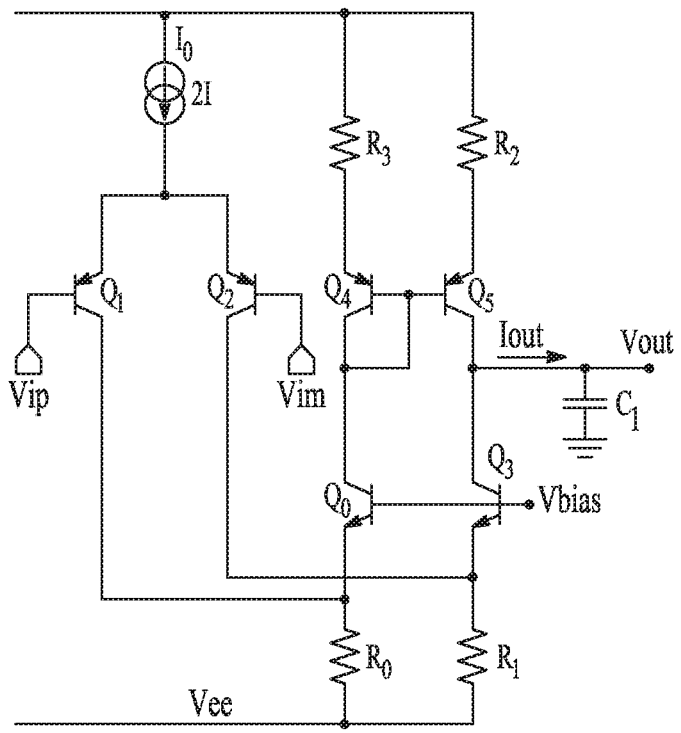
FIG. 1 illustrates generally an example of a folded cascode input stage as implemented in a bipolar process.
Figure 2:
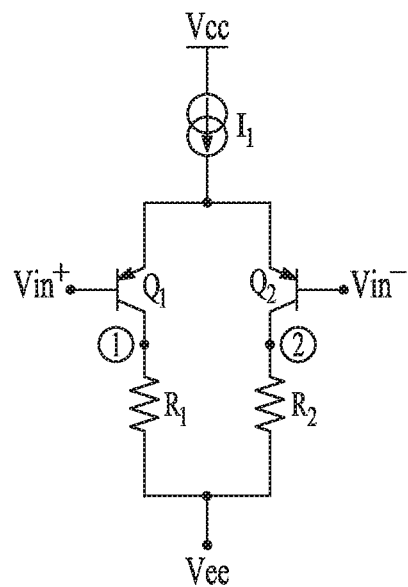
FIG. 2 illustrates generally an example of a bipolar differential input pair of transistors.

FIG. 2 illustrates generally an example of a bipolar (or other) differential input pair of transistors 200. The bipolar differential input pair of transistors 200 can include first and second pnp transistors $Q_1$ and $Q_2$ having inputs at their respective base terminals. A differential input signal at the base terminals is provided by Vin+ and Vin−. The emitters of transistors $Q_1$ and $Q_2$ are coupled to a positive supply rail Vcc, such as via a stable bias current source $I_1$, and the collectors of transistors $Q_1$ and $Q_2$ are coupled via respective resistors $R_1$ and $R_2$ to a negative supply rail Vee or to a ground node.

For the bipolar input pair of transistors 200 from FIG. 2, transistors $Q_1$ and $Q_2$ are biased in a forward active region of amplifier operation. That is, for each transistor of the pair, the base-to-emitter junction is strongly forward biased and the collector-to-base junction is reversed biased or weakly forward biased. For a pnp input pair, the active region is generally provided when an emitter-to-collector voltage is at least about 200 mV.

For a negative supply-sensing amplifier configuration, the voltages at nodes 1 and 2 (at the collector terminals of the transistors $Q_1$ and $Q_2$, respectively) should be limited to be about 400 mV to 500 mV above the voltage at the rail Vee. In an example, let Vin+ and Vin− have the same voltage value as the node Vee, corresponding to a differential input voltage of 0 V, and let the emitter-to-base voltages of $Q_1$ and $Q_2$ be 700 mV. In this example, if the voltages at nodes 1 and 2 are about 500 mV or less, then $Q_1$ and $Q_2$ are in the forward active region of operation. Increasing the voltages at nodes 1 and 2, such as by increasing the values of resistors $R_1$ and $R_2$, can cause $Q_1$ and $Q_2$ to go into the saturation region, which can compromise performance by reducing the common mode range of the amplifier.

Similarly, if respective resistors $R_3$ and $R_4$ (not shown in FIG. 2) are coupled at the emitter terminals of $Q_1$ and $Q_2$, such as between the emitters and the current source $I_1$, then an upper limit of the common mode range would be adversely affected. For example, if the current source $I_1$ is implemented using a BJT transistor $Q_0$ (not shown), then the voltage drops across the resistors $R_3$ and Rd can cause transistor $Q_0$ to operate outside of its active region. Furthermore, resistors $R_3$ and $R_4$ can adversely influence noise characteristics of the amplifier.

Figure 3:
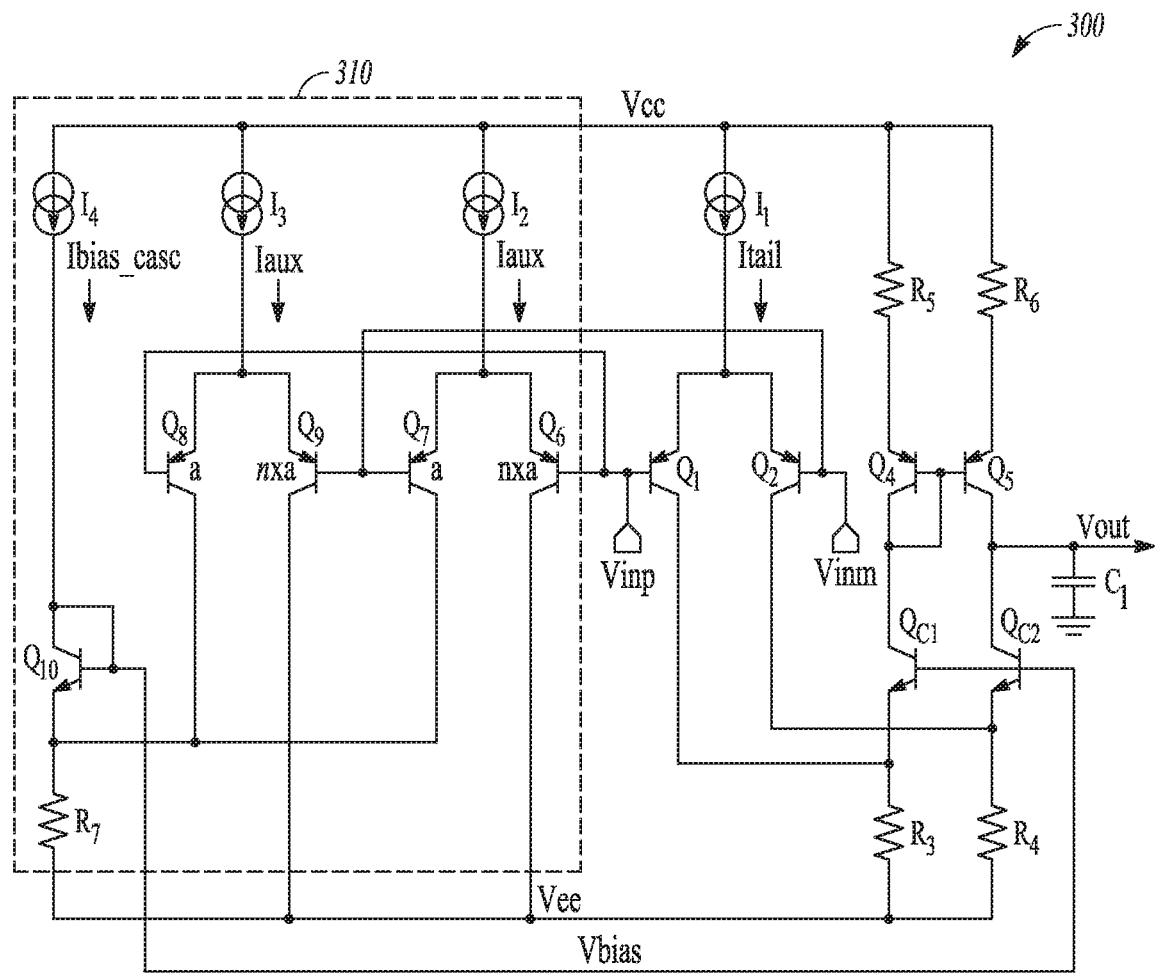
FIG. 3 illustrates generally an example of a first amplifier input stage with a bias circuit and cascode output.

FIG. 3 illustrates generally an example of a first amplifier input stage 300. The first amplifier input stage 300 includes a folded cascode output stage and is configured to amplify an input signal having a voltage that can extend to at least one of the supply voltage rails of the amplifier. In the example of FIG. 3, the supply rails respectively receive signals Vcc and Vee. In an example, the first amplifier input stage 300 is configured to amplify input signals that can have a voltage magnitude that is similarly valued to a voltage magnitude of Vee. The first amplifier input stage 300 is shown in FIG. 3 as being configured as a negative supply sensing amplifier, however, in an example, the input stage 300 can be configured as a positive supply sensing amplifier. The example of FIG. 3 further includes a dynamic bias circuit 310 that provides a variable voltage bias signal for the cascode output stage, such as in response to a magnitude and sign of a sensed input voltage, such as explained herein.

The first amplifier input stage 300 includes differential input nodes that respectively receive input signals Vinp and Vinm. In the example of FIG. 3, the differential input nodes correspond to respective base terminals of first and second transistors $Q_1$ and $Q_2$, which are arranged as a first differential pair. The emitters of the first and second transistors $Q_1$ and $Q_2$ are coupled to each other and to a first current source $I_1$ that is configured to provide a current signal $I_{tail}$. Based on a magnitude of a difference between the input signals Vinp and Vinm (that is, based on the differential input signal to the first amplifier input stage 300), one or both of transistors $Q_1$ and $Q_2$ conducts current from the first current source $I_1$ to a cascode output stage. The cascode output stage comprises third and fourth transistors $Q_{C1}$ and $Q_{C2}$.

In the example of FIG. 3, the first amplifier input stage 300 includes a folded cascode output stage. The output is provided at an output node at the collector terminal of the fourth transistor $Q_{C2}$. The output node is coupled to a load capacitor $C_1$, such as having a capacitance value Cc that influences a slew rate of the output node of the amplifier. Output voltage and current signals, Vout and Iout, respectively, are provided at the output node, such as to a main stage of an amplifier. In an example, the output node is configured to source or sink a current signal having a magnitude that is based on a polarity of the differential input signal at the differential input nodes at the bases of transistors $Q_1$ and $Q_2$.

The first amplifier input stage 300 includes a dynamic bias circuit 310 that provides a variable voltage bias signal Vbias, or cascode control signal, for the cascode output stage. The dynamic bias circuit 310 comprises two differential transistor pairs, including a second differential pair comprising transistors $Q_6$ and $Q_7$, and a third differential pair comprising transistors $Q_8$ and $Q_9$. The second differential pair comprising $Q_6$ and $Q_7$ is coupled to a second stable current source $I_2$ configured to provide a constant bias current signal $I_{AUX}$, and the third differential pair comprising $Q_8$ and $Q_9$ is coupled to a third stable current source $I_3$ configured to provide a constant bias current signal $I_{AUX}$.

In the example of FIG. 3, the second and third differential pairs are unbalanced, meaning that the transistors comprising the pairs have different device characteristics. For example, transistors $Q_7$ and $Q_8$ can have a first device area characteristic, and transistors $Q_6$ and $Q_9$ can have a second device area characteristic, and the first device area characteristic can indicate a lesser device area than the second device area characteristic. A device area characteristic can include an effective base-emitter junction area. The effective area can be based on physical size features of a particular transistor, or the effective area can be based on a combination of similarly or differently sized transistors that are connected together. In the example of FIG. 3, transistors $Q_7$ and $Q_8$ are each indicated to have an area "a", and transistors $Q_6$ and $Q_9$ are each indicated to have an area "n*a" where n is greater than 1.

The second and third differential pairs each are structured to have an intentional input offset voltage because of the device area mismatch. At room temperature, the offset is $V_T \ln(n)$, where n is the ratio of the areas of the devices, and $V_T$ is the thermal voltage, generally equal to about 25.7 mV at room temperature. To reduce temperature dependence, resistors can be provided between the respective emitters of transistors $Q_8$ and $Q_9$ and their corresponding stable current sources $I_3$ and $I_2$, or the device area ratio of transistors $Q_8$ and $Q_7$ can be reduced.

In an example, an offset between transistors comprising the second and third differential pairs (e.g., pairs $Q_6/Q_7$ and $Q_8/Q_9$) is implemented using area mismatch, such as described above, and respective resistors provided in series at the emitters of $Q_8$ and $Q_7$. Implementing the offsets solely by area mismatch can introduce transient effects, such as owing to temperature dependence and relatively large junction capacitances in the transistors of $Q_9$ and $Q_6$. Adding the resistors in series at the respective emitters of $Q_8$ and $Q_7$ can also improve high frequency distortion characteristics, such as compared to other biasing arrangements. For example, the improvement in distortion can be a result of lower transistor device capacitances.

Respective differential input terminals of the second and third differential pairs are coupled to the differential input nodes that receive input signals Vinp and Vimn. That is, one of the transistors in each of the second and third differential pairs receives the input signal Vinp and the other one of the transistors in each of the pairs receives the input signal Vinm. In the example of FIG. 3, a base terminal of each of transistors $Q_6$ and $Q_8$ receives Vinp, and a base terminal of each of transistors $Q_7$ and $Q_9$ receives Vinm.

The dynamic bias circuit 310 is configured to perform various functions. For example, the dynamic bias circuit 310 senses a magnitude of the differential input signal at the differential input nodes at the bases of transistors $Q_1$ and $Q_2$ and, in response, updates a value of Vbias, the cascode control signal. In an example, a magnitude of Vbias can be independent of a polarity of the differential input signal. Based on values of Vbias, the cascode transistors $Q_{C1}$ and $Q_{C2}$ can be dynamically configured to carry correspondingly more or less current. The first amplifier input stage 300 is thereby configured to more efficiently operate by consuming less overall current, as further described below, and to be less noisy than other cascode input stages. In an example, the dynamic bias circuit 310 senses a magnitude of the differential input signal at the differential input nodes and, in response, provides signals to a slew boost circuit to update a magnitude of current available at the output (e.g., at the collector of $Q_{C2}$) to thereby increase slew rate of the first amplifier input stage 300. The slew boost circuit is further described below in the discussion of FIG. 4.

In operation of the first amplifier input stage 300, the stable first current source $I_1$ provides a constant bias current signal $I_{tail}$ to the emitter terminals of the first and second transistors $Q_1$ and $Q_2$. As the magnitude of $I_{tail}$ is increased, the current through the cascode transistors $Q_{C1}$ and $Q_{C2}$ correspondingly increases, for example because of the current mirror arrangement of the transistors $Q_4$ and $Q_5$ coupled to the cascode stage. Collector terminals of the transistors $Q_{C1}$ and $Q_{C2}$ are coupled respectively to emitter terminals of the cascode transistors $Q_{C1}$ and $Q_{C2}$, and are coupled respectively to resistors $R_3$ and $R_4$. The resistors $R_3$ and $R_4$ generally help reduce noise contributions of the transistors $Q_1, Q_2, Q_{C1}$ and $Q_{C2}$, for example at the supply rail Vee. For the supply-sensing configuration of FIG. 3, other resistors around the input differential pair $Q_1$ and $Q_2$, such as at the emitter terminals of these devices, can be avoided as such other resistors could introduce noise and degrade performance.

Given a current budget for the first amplifier input stage 300, it can be desired to increase a magnitude of a current through the input differential pair $Q_1$ and $Q_2$ but to reduce or minimize current consumption elsewhere in the circuit, such as in the cascode stage and in the current mirror comprising transistors $Q_4$ and $Q_5$. For example, it can be undesirable to simply increase an overall current available, such as from the first current source $I_1$, because then the current mirror comprising transistors $Q_4$ and $Q_5$, which feeds the output and the cascode devices, will be configured to accommodate the same increased current. In other words, it can be desirable to accommodate more current through the input differential pair $Q_1$ and $Q_2$ while concurrently reducing or minimizing an amount of current consumed elsewhere in the input stage when the differential input signal is small. That is, a magnitude of current provided to the output stage that comprises the current mirror of transistors $Q_4$ and $Q_5$ and the cascode transistors $Q_{C1}$ and $Q_{C2}$ can be reduced or minimized when the differential input signal is small.

In an example, if the first amplifier input stage 300 is balanced (the input signals Vinp and Vinm are substantially equal in magnitude), then each of $Q_1$ and $Q_2$ carries a current $I_{tail}/2$. If the first amplifier input stage 300 is unbalanced and a large differential input signal is present, then one of $Q_1$ and $Q_2$ carries substantially all of the current $I_{tail}$. Furthermore, some amount of trickle current, such as an emitter-collector current, is generally present on the cascode transistors $Q_{C1}$ and $Q_{C2}$, which contributes to a total current through each of the resistors $R_3$ and $R_4$. Thus, to accommodate large differential input signals, each of the resistors $R_3$ and $R_4$ is adequately sized and configured with a resistance value such as to carry at least current signals having magnitudes of $I_{tail}$ plus some amount of trickle current attributed to the cascode transistors $Q_{C1}$ and $Q_{C2}$.

If $I_{tail}$ is increased, such as to provide greater speed, or slew rate, and reduced noise, then the cascode output stage and the resistors $R_3$ and $R_4$ will each carry a greater amount of current, including during quiescent operation or when a differential input signal magnitude is relatively small. This can be undesirable because of increased current consumption. However, in an example, the dynamic bias circuit 310 can be used to provide a dynamically-variable cascode biasing voltage such as to control the cascode stage to conduct a limited amount of current during periods when the differential input signal magnitude is relatively small, and to conduct a greater amount of current during periods when the differential input signal magnitude is relatively large.

As discussed above, the dynamic bias circuit 310 includes the second and third differential pairs, including transistors $Q_6$ and $Q_7$ which are implemented with different device area characteristics, and the transistors $Q_8$ and $Q_9$ which are implemented with different device area characteristics. The dynamic bias circuit 310 further includes a diode-connected transistor $Q_{10}$ that is supplied by a fourth current source $I_4$ and a current signal $I_{bias\_casc}$. The emitter of transistor $Q_{10}$ is coupled via a resistor $R_7$ to Vee.

In operation of the first amplifier input stage 300 when the differential input signal is small, current flowing from the first differential pair of transistors $Q_1$ and $Q_2$ into $R_3$ and/or $R_4$ is generally close to $I_{tail}/2$. If the differential input signal is large, then a greater amount of current flows through one side of the first differential pair and, correspondingly, through one or the other of $R_3$ and $R_4$. Additionally, when the differential input signal is large, a portion of $I_{AUX}$ from the second and third current sources $I_2$ and $I_3$ is respectively conducted via transistors $Q_7$ and $Q_8$ to resistor $R_7$. As current through $R_7$ increases, the magnitude of Vbias correspondingly increases due to the forward voltage at the base-emitter junction of transistor $Q_{10}$. As Vbias, or the cascode control signal, increases, current signals in the resistors $R_3$ and $R_4$ similarly increase to prevent current starvation of the cascode transistors $Q_{C1}$ and $Q_{C2}$. This configuration enables a quiescent current provided by $Q_{C1}$ and $Q_{C2}$ to be less than Itail/2, such as for small differential input signals. The configuration further enables currents provided by $Q_{C1}$ and $Q_{C2}$ to be large when needed, such as when the differential input signal is large.

In an example, when there is a differential input signal (that is, when Vinp>>Vinm or Vinp<<Vinm), then current in one or the other of transistors $Q_7$ or $Q_8$ increases and causes an increase in a voltage at the bases of cascode transistors $Q_{C1}$ and $Q_{C2}$ and increases current in the resistors $R_3$ and $R_4$. The increased currents can help prevent the collector currents of $Q_{C1}$ and $Q_{C2}$ from reaching negligible values during either condition.

In an example, diode-connected transistor $Q_{10}$ is maintained in an "on" state (e.g., the transistor can be weakly forward biased) when the differential input signal magnitude is small or negligible. Since $Q_{10}$ is maintained in an "on" state, the transistor $Q_{10}$ can more rapidly respond to changes and thereby Vbias can be more quickly updated to reflect changes in the differential input signal.

Figure 4:
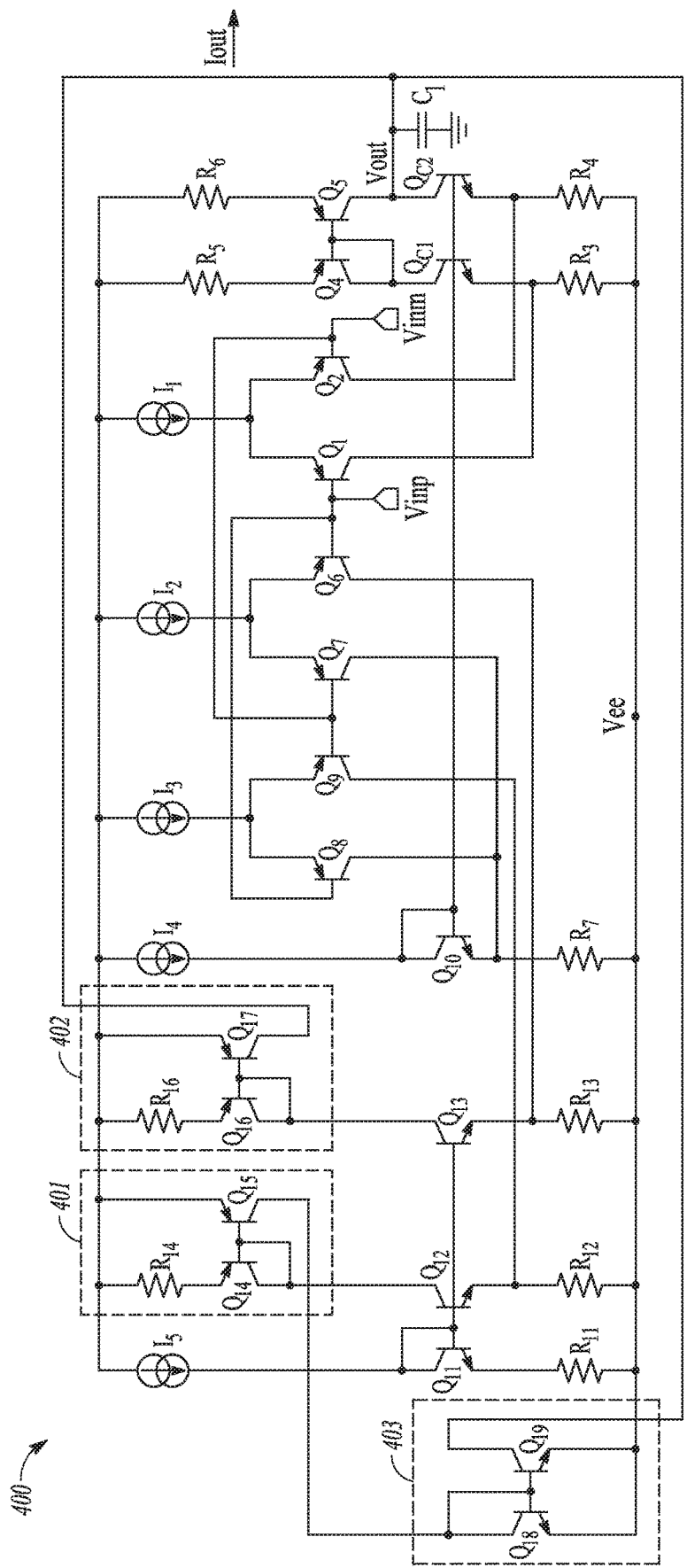
FIG. 4 illustrates generally an example of a second amplifier input stage with a bias circuit, slew boost circuit, and cascode output.

FIG. 4 illustrates generally an example of a second amplifier input stage 400. The second amplifier input stage 400 includes various features from the first amplifier input stage 300 and includes a slew boost circuit. Identically named devices in the second amplifier input stage 400 are generally similarly or identically configured to those described above in the first amplifier input stage 300. For example, the second amplifier input stage 400 includes the differential input nodes that receive input signals Vinp and Vinm at respective base terminals of the first and second transistors $Q_1$ and $Q_2$, which are arranged as a first differential pair. The second amplifier input stage 400 includes the cascode output stage with the third and fourth transistors $Q_{C1}$ and $Q_{C2}$. The second amplifier input stage 400 further includes the dynamic bias circuit that provides the bias signal Vbias, or cascode control signal, for the cascode output stage. The dynamic bias circuit comprises the same two differential transistor pairs, including the second differential pair comprising transistors $Q_6$ and $Q_7$, and the third differential pair comprising transistors $Q_8$ and $Q_9$. Transistors comprising the second and third differential pairs have an unbalanced or device area mismatch as described above in the discussion of FIG. 3.

Slew performance of the second amplifier input stage 400 is generally limited by a supply current for the input stage and a capacitance at the output node. For example, at rate of change of Vout is $I_{tail}/Cc$, where Cc is the capacitance of the output capacitor $C_1$. Thus slew performance can be improved by increasing a magnitude of the current at the output node or by reduce the output capacitance.

The slew boost circuit is provided to enhance slew performance of the second amplifier input stage 400 by changing an amount of current available for sourcing or sinking at the output node. The slew boost circuit updates the current at the output node based on a magnitude and a polarity of the differential input signal at the differential input nodes of first differential pair of transistors $Q_1$ and $Q_2$. As described above, the dynamic bias circuit senses the magnitude and polarity of the differential input signal at the differential input nodes and, in response, provides signals to the slew boost circuit. In the example of FIG. 4, the collectors of transistors $Q_6$ and $Q_9$ (the devices with larger device area characteristics relative to their paired devices $Q_7$ and $Q_8$, respectively) from the dynamic bias circuit provide the magnitude and polarity information to the slew boost circuit. Since the transistors $Q_6$ and $Q_9$ are relatively large devices, they are configured to pass larger current signals than the other devices in their respective pairs for a given differential input signal.

In the example of FIG. 4, the second amplifier input stage 400 includes a fifth current source 15 that can provide a current $I_{slew}$ to a diode-connected transistor $Q_{11}$. The emitter of transistor $Q_{11}$ can be coupled to Vee via a bias resistor $R_{11}$. The base of transistor $Q_{11}$ provides a bias voltage that is a function of $R_{11}$, the forward-voltage of $Q_{11}$, and Islew. That is, the bias voltage for the slew boost circuit can be $I_{slew}*R_{11}+Vbe(Q_{11})$.

The bias voltage for the slew boost circuit is applied to the bases of transistors $Q_{12}$ and $Q_{13}$, which are arranged in a current mirror configuration with transistor $Q_{11}$. The emitters of transistors $Q_{12}$ and $Q_{13}$ are coupled to the dynamic bias circuit at the collectors of $Q_9$ and $Q_6$, respectively, as further described below. Current through transistor $Q_{12}$ is modulated by the signal from $Q_9$, and triggers a corresponding current through a first slew current mirror 401 comprising transistors $Q_{14}$ and $Q_{15}$. In an example, the first slew current mirror 401 includes a resistor $R_{14}$ in the current path of transistor $Q_{14}$, and the first slew current mirror 401 has other than a 1:1 input-to-output ratio. For example, as the current in transistor $Q_{12}$ increases, the forward voltage (Veb) on transistor $Q_{14}$ changes, and thus the current through resistor $R_{14}$ changes. The current mirrored through transistor $Q_{15}$ is thus a function (e.g., an exponential function) of the current in $Q_{14}$.

In the example of FIG. 4, the output of transistor $Q_{15}$ is coupled to a third slew current mirror 403. The third slew current mirror 403 comprises transistors $Q_{18}$ and $Q_{19}$. The third slew current mirror 403 is configured to invert a polarity of the current signal received from the first slew current mirror 401, and the output of the third slew current mirror 403 is coupled to the output node. In an example, the second amplifier input stage 400 can be implemented without the third slew current mirror 403. In this example, the output of the first slew current mirror 401 would be coupled to the output node, and the current at the output node would be independent of the polarity of the differential input signal. In other words, without the third slew current mirror 403 to invert a direction of the current signal from the first slew current mirror 401, the slew boost circuit would respond to changes in magnitude of the differential input signal but current provided by the slew boost circuit would not change sign based on the polarity of the differential input signal.

In an example, the current through transistor $Q_{13}$ is modulated by the signal from $Q_6$ and triggers a corresponding current through a second slew current mirror 402 comprising transistors $Q_{16}$ and $Q_{17}$. In an example, the second slew current mirror 402 includes a resistor $R_{16}$ in the current path of transistor $Q_{16}$, and the second slew current mirror 402 is configured to have other than a 1:1 input-to-output ratio. For example, as the current in transistor $Q_{13}$ increases, the forward voltage (Veb) on transistor $Q_{16}$ changes, and thus the current through resistor $R_{16}$ changes. The current mirrored through transistor $Q_{17}$ is thus a function e.g., an exponential function) of the current in $Q_{16}$.

The current through transistor $Q_{11}$ is thus mirrored through transistors $Q_{12}$ and $Q_{13}$ as a function of the differential input signal. The current signals mirrored through transistors $Q_{12}$ and $Q_{13}$ are further mirrored through the first, second, and/or third slew current mirrors 401, 402, and/or 403, to provide exponential currents in $Q_{15}$ or $Q_{17}$ depending on a polarity of the differential input signal.

To conserve power, current in transistors $Q_{12}$ and $Q_{13}$ can be reduced or minimized. For example, as current through $R_{12}$ is increased, a current through $Q_{12}$ can be decreased. Referring again to the dynamic bias circuit, if the differential input signal is small, then a negligible or minimal amount of current passes through transistors $Q_7$ and $Q_8$. However, owing to the device area differences in the respective second and third differential pairs of transistors, a relatively larger amount of current passes through transistors $Q_6$ and $Q_9$. Thus the circuit can be tuned such that, for small differential input signals, a magnitude of a current signal conducted by transistor $Q_9$ can provide a slew control signal that causes a voltage drop across $R_{12}$ that is sufficiently large to turn off transistor $Q_{12}$, or to place transistor $Q_{12}$ at or near its on/off threshold. Under these conditions, no additional current is mirrored, or provided to the output node, such as using the first and third slew current mirrors 401 and 403. Similarly, transistor $Q_{13}$ can be turned off or placed near its on/off threshold due to a slew control signal conducted by transistor Q6 and provided to resistor R13.

In other words, during quiescent operation of the second amplifier input stage 400, slew control current signals from $Q_9$ and $Q_6$ can substantially deactivate $Q_{12}$ and $Q_{13}$, respectively, thereby causing limited or no current to be provided from $Q_{17}$ and/or from $Q_{19}$ to the output node. However, when a differential input signal is applied at the differential input nodes, then a slew control signal is generated by transistors $Q_9$ or $Q_6$ and one of transistors $Q_{19}$ and $Q_{17}$ will provide current to the output node based on a polarity of the differential input signal. The particular one of transistors $Q_{19}$ and $Q_{17}$ that is activated depends on the polarity of the differential input signal, which in turn determines which of $Q_9$ or $Q_6$ is activated to provide the slew control signal.

In an example, transistors $Q_{12}$ and $Q_{13}$ are maintained in an "on" state (e.g., the transistors are weakly forward biased) when the differential input signal magnitude is small or negligible. When transistors $Q_{12}$ and $Q_{13}$ are maintained in an "on" state, the transistors can more rapidly respond to changes and thereby better enhance slew performance of the circuit.

Referring now to an example that illustrates various features of the second amplifier input stage 400, let Vinp be substantially equal to Vinm. In this example, the differential input signal applied to the respective base terminals of the first and second transistors $Q_1$ and $Q_2$, which are arranged as a first differential pair, is substantially zero volts. When Vinp=Vinm, then transistors $Q_9$ and $Q_6$ provide respective current signals to resistors $R_{12}$ and $R_{13}$, thereby causing the voltages at the emitters of transistors $Q_{12}$ and $Q_{13}$ to be relatively greater than a voltage at the emitter of transistor $Q_{11}$. In an example, a voltage difference of 150 mV between the emitter of transistor $Q_{11}$ and the emitters of transistors $Q_{12}$ and/or $Q_{13}$ can reduce the collectors currents of transistors $Q_{12}$ and/or $Q_{13}$ by a factor of more than about $\exp(100\ mV/V_T) \sim =400$. For example, the collector currents of transistors $Q_{12}$ and $Q_{13}$ can be small, and accordingly the collector currents of transistors $Q_{19}$ and $Q_{17}$ are correspondingly small. Thus the difference in magnitudes of the collector currents of transistors $Q_{19}$ and $Q_{17}$ is small. In an example, when there is no differential input signal, the transistors $Q_{19}$ and $Q_{17}$ have a negligible contribution to the output current Iout.

In this example with no differential input signal, the collector currents of transistors $Q_8$ and $Q_7$ are small and provide a negligible amount of current to resistor $R_7$. Therefore the bias voltage Vbias, or cascode control signal, at the bases of the cascode transistors $Q_{C1}$ and $Q_{C2}$ is approximately $(I_{tail}/2)(R_7)$+Vbe, and a magnitude of the current in $R_3$ is approximately $(I_{tail}/2)(R_7)/(R_3)$, which can be designed to be smaller than bait.

In another example that illustrates various features of the second amplifier input stage 400, let Vinp be substantially less than Vinm. Under these conditions, a collector current of transistor $Q_9$ is negligible, and accordingly the collector current of transistor $Q_{12}$ is increased, while a collector current of transistor $Q_{13}$ is small or negligible. The collector current of transistor $Q_{12}$ is mirrored through the first and third slew current mirrors 401 and 403. In an example, the first slew current mirror 401 is configured as a high gain current mirror including transistors $Q_{14}$ and $Q_{15}$, and a collector current of $Q_{15}$ is approximately $(m_1 I_{C\_Q12})(\exp(m_1 I_{C\_Q12}(R14)/V_T))$, where $m_1$ is a ratio of the emitter areas of $Q_{15}$ and $Q_{14}$. The collector current of $Q_{15}$ is then mirrored through the third slew current mirror 403 and added to Iout, thereby causing Iout to pull Vout low.

In another example that illustrates various features of the second amplifier input stage 400, let Vinp be substantially greater than Vinm. Under these conditions, a collector current of transistor $Q_6$ is negligible, and accordingly the collector current of transistor $Q_{13}$ is increased, while a collector current of transistor $Q_{12}$ is small or negligible. The collector current of transistor $Q_{13}$ is mirrored through the second slew current mirror 402, such as can be configured as a high gain current mirror using transistors $Q_{16}$ and $Q_{17}$. In an example, a collector current of $Q_{16}$ is approximately $(m_2 I_{C\_Q13})(\exp(m_2 I_{C\_Q13}(R_{16})/V_T))$, where $m_2$ is a ratio of the emitter areas of $Q_{17}$ and $Q_{16}$. The output of the second slew current mirror 402 is added to Iout, thereby causing Iout to pull Vout high.

In an example, if a transconductance characteristic of an amplifier circuit is high, then amplifier stability can be compromised. Various components of the second amplifier input stage 400 can be selected to adjusted to modify a transconductance characteristic of the circuit. For example, the current mirror circuits (e.g., the first, second, and/or third slew current mirrors 401, 402, or 403) include components, such as the resistors $R_{14}$ or $R_{16}$, that can be selected or adjusted to influence a magnitude of the current signal that each mirror circuit provides. Accordingly the second amplifier input stage 400 can be modified to different use cases to help avoid stability issues due to high transconductance.

Although the examples illustrated in the figures are generally presented as including BJT transistor devices, similar examples can be provided using MOS or other FET transistor devices.

In an example, as mentioned previously, a problem to be solved includes providing an amplifier input stage with reduced current consumption and/or improved speed or slew rate. Various aspects of the present disclosure can help provide a solution to this and other problems associated with amplifier circuits and amplifier input stage circuits.

In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a cascode amplifier circuit capable of amplifying a differential input signal having a common mode component that can extend to at least one power supply rail for the amplifier circuit. That is, Aspect 1 can include a supply-sensing amplifier circuit. The circuit can include an input stage including a first differential transistor pair, the input stage configured to receive the differential input signal at respective input nodes and in response conduct a differential first current and a cascode output stage including a cascode control signal that is adjusted in response to the differential input signal sensed at the input nodes of the first differential transistor pair.

Aspect 2 can include or use, or can optionally be combined with the subject matter of Aspect 1, to optionally include or use the cascode control signal being independent of a transconductance of the first differential transistor pair.

Aspect 3 can include or use, or can optionally be combined with the subject matter of one or any combination of Aspects 1 or 2 to optionally include the input stage having a current source, and the first differential transistor pair is coupled to the current source and configured to conduct the differential first current from the current source.

Aspect 4 can include or use, or can optionally be combined with the subject matter of one or any combination of Aspects 1 through 3 to optionally include or use the cascode output stage having a folded cascode circuit comprising a first cascode transistor coupled to one transistor of the first differential transistor pair, a second cascode transistor coupled to the other transistor of the first differential transistor pair, and respective resistors coupled between the first and second cascode transistors and a power supply rail for the amplifier circuit.

Aspect 5 can include or use, or can optionally be combined with the subject matter of one or any combination of Aspects 1 through 4 to optionally include or use a bias circuit configured to generate the cascode: control signal based on a magnitude of the differential input signal and independent of a polarity of the differential input signal.

Aspect 6 can include or use, or can optionally be combined with the subject matter of Aspect 5, to optionally include or use the bias circuit having input terminals that are coupled to the same input nodes of the input stage to thereby receive the same differential input signal, such as without any intervening components or signal processing.

Aspect 7 can include or use, or can optionally be combined with the subject matter of one or any combination of Aspects 1 through 6 to optionally include or use a bias circuit configured to generate the cascode control signal based on the differential input signal and to generate a slew control signal based on the differential input signal, and a slew boost circuit configured to receive the slew control signal and in response source or sink current at an output node of the cascode output stage based on a magnitude and polarity of the differential input signal.

Aspect 8 can include or use, or can optionally be combined with the subject matter of Aspect 7, to optionally include or use the bias circuit comprising second and third differential transistor pairs, and respective inputs of each of the second and third differential transistor pairs is configured to receive the same differential input signal.

Aspect 9 can include or use, or can optionally be combined with the subject matter of Aspect 8, to optionally include one transistor in each of the second and third differential transistor pairs having a different device area characteristic than the other transistor in the same pair.

Aspect 10 can include or use, or can optionally be combined with the subject matter of Aspect 9, to optionally include or use the bias circuit being coupled to transistors from the second and third differential transistor pairs having lesser device area. In an example, Aspect 10 can include the slew boost circuit coupled to other ones of the transistors from the second and third differential transistor pairs having greater device area characteristics.

Aspect 11 can include or use, or can optionally be combined with the subject matter of one or any combination of Aspects 8 through 10 to optionally include or use the bias circuit being configured to generate the cascode control signal based on signals conducted by one transistor from each of the second and third differential transistor pairs, and the bias circuit is configured to generate the slew control signal based on signals conducted by the other transistor from each of the second and third transistor pairs.

Aspect 12 can include or use, or can optionally be combined with the subject matter of one or any combination of Aspects 8 through 11 to optionally include or use the slew boost circuit having at least first and second current mirror circuits, wherein the first current mirror circuit is configured to source current at the output node and wherein the second current mirror circuit is configured to sink current at the output node.

Aspect 13 can include or use, or can optionally be combined with the subject matter of Aspect 12, to optionally include, when the differential input signal is non-zero: (1) the first current mirror circuit is configured to source a first amount of current corresponding to a magnitude of a current signal provided by a first transistor of the second differential transistor pair, and (2) the second current mirror is configured to sink a second amount of current corresponding to a magnitude of a current signal provided by a first transistor of the third differential transistor pair.

Aspect 14 can include or use subject matter (such as an apparatus, a system, a device, a method, a means for performing acts, or a device readable medium including instructions that, when performed by the device, can cause the device to perform acts, or an article of manufacture), such as can include or use a supply-sensing amplifier with a folded-cascode output, the supply-sensing amplifier comprising a first differential transistor pair configured to receive a differential input signal at respective input nodes and in response conduct a differential first current to a cascode-protected output node. Aspect 14 can further include a second differential transistor pair configured to receive information about the differential input signal, a third differential transistor pair configured to receive information about the differential input signal, and a cascode output configured to receive a cascode control signal, wherein the cascode control signal is based on signals conducted by a first transistor from the second differential transistor pair and by a first transistor from the third differential transistor pair. In an example, respective input nodes of each of the first, second, and third differential transistor pairs are coupled to receive the same input signal.

Aspect 15 can include or use, or can optionally be combined with the subject matter of Aspect 14, to optionally include a device area of the first transistor from the second differential transistor pair is different than a device area of a second transistor from the second differential transistor pair, and a device area of the first transistor from the third differential transistor pair is different than a device area of a second transistor from the third differential transistor pair.

Aspect 16 can include or use, or can optionally be combined with the subject matter of one or any combination of Aspects 14 or 15 to optionally include or use a slew boost circuit configured to receive a slew control signal that is based on signals conducted by a second transistor from the second differential transistor pair and by a second transistor from the third differential transistor pair, and wherein the slew boost circuit is configured to source or sink current at the cascode-protected output node based on the slew control signal.

Aspect 17 can include or use, or can optionally be combined with the subject matter of one or any combination of Aspects 14 through 16 to optionally include or use the cascode control signal being independent of a transconductance characteristic of at least the first differential transistor pair.

Aspect 18 can include or use subject matter (such as an apparatus, a system, a device, a method, a means for performing acts, or a device readable medium including instructions that, when performed by the device, can cause the device to perform acts, or an article of manufacture), such as can include or use a method for amplifying a differential input signal using an amplifier circuit, and the amplifier circuit is capable of amplifying input signals having a component that can extend to at least one power supply rail of the amplifier circuit. That is, Aspect 18 can include a method for operating a supply-sensing amplifier. Aspect 18 can include receiving the differential input signal at a first differential transistor pair and, in response, providing a differential first current to a cascode output stage of the amplifier circuit, and generating a cascode control signal based on the differential input signal, wherein the cascode control signal is independent of a transconductance of the first differential transistor pair, and providing an Output signal from an output node of the cascode output stage based on the differential first current and the cascode control signal.

Aspect 19 can include or use, or can optionally be combined with the subject matter of Aspect 18, to optionally include or use generating a slew boost control signal based on the differential input signal and, using a slew boost circuit, sinking or supplying current at the output node of the cascode stage based on the differential input signal.

Aspect 20 can include or use, or can optionally be combined with the subject matter of Aspect 19, to optionally include receiving the differential input signal at second and third differential transistor pairs, wherein the generating the cascode control signal includes using a combined signal from first legs of the second and third differential transistor pairs and wherein the generating the slew boost control signal includes using signals from other legs of the second and third differential transistor pairs. In an example, respective devices in the second and third differential transistor pairs have different device area characteristics.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," and unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A cascode amplifier circuit capable of amplifying a differential input signal having a common mode component that can extend to at least one power supply rail for the amplifier circuit, the amplifier circuit comprising:
   an input stage including a first differential transistor pair, the input stage configured to receive the differential input signal at respective input nodes and in response conduct a differential first current; and
   a cascode output stage including first and second cascode transistors configured to receive a cascode control signal that is adjusted in response to a magnitude of the differential input signal at the input nodes of the first differential transistor pair, wherein the first cascode transistor is coupled to an output node of the amplifier circuit.

2. The amplifier circuit of claim 1, wherein a magnitude of the cascode control signal is independent of a transconductance of the first differential transistor pair.

3. The amplifier circuit of claim 1, wherein the input stage includes a current source and wherein the first differential transistor pair is coupled to the current source and configured to conduct the differential first current from the current source.

4. The amplifier circuit of claim 1, wherein the cascode output stage includes a folded cascode circuit comprising:
   the first cascode transistor coupled to one transistor of the first differential transistor pair, and coupled to receive the cascode control signal that is adjusted in response to the differential input signal sensed at the input nodes of the first differential transistor pair;
   the second cascode transistor coupled to the other transistor of the first differential transistor pair, and coupled to receive the cascode control signal that is adjusted in response to the differential input signal sensed at the input nodes of the first differential transistor pair; and
   respective resistors coupled between the first and second cascode transistors and a power supply rail for the amplifier circuit.

5. The amplifier circuit of claim 1, further comprising a bias circuit configured to generate the cascode control signal independent of a polarity of the differential input signal.

6. The amplifier circuit of claim 5, wherein the bias circuit includes input terminals that are coupled to the input nodes of the input stage to receive the same differential input signal.

7. The amplifier circuit of claim 1, further comprising:
   a bias circuit configured to generate the cascode control signal based on the differential input signal and to generate a slew control signal based on the differential input signal; and
   a slew boost circuit configured to receive the slew control signal and in response source or sink current at the output node based on a magnitude and polarity of the differential input signal.

8. The amplifier circuit of claim 7, wherein the bias circuit comprises second and third differential transistor pairs configured to receive the same differential input signal.

9. The amplifier circuit of claim 8, wherein one transistor in each of the second and third differential transistor pairs has a different effective device area characteristic than the other transistor in the same pair.

10. The amplifier circuit of claim 9, wherein the bias circuit is coupled to transistors from the second and third differential transistor pairs having lesser device area, and wherein the slew boost circuit is coupled to other ones of the transistors from the second and third differential transistor pairs having greater device area characteristics.

11. The amplifier circuit of claim 8, wherein the bias circuit is configured to generate the cascode control signal based on signals conducted by one transistor from each of the second and third differential transistor pairs, and wherein the bias circuit is configured to generate the slew control signal based on signals conducted by the other transistor from each of the second and third transistor pairs.

12. The amplifier circuit of claim 8, wherein the slew boost circuit comprises at least first and second current mirror circuits, wherein the first current mirror circuit is configured to source current at the output node and wherein the second current mirror circuit is configured to sink current at the output node.

13. The amplifier circuit of claim 12, wherein when the differential input signal is non-zero:
   the first current mirror circuit is configured to source a first amount of current corresponding to a magnitude of a current signal provided by a first transistor of the second differential transistor pair, and
   the second current mirror is configured to sink a second amount of current corresponding to a magnitude of a current signal provided by a first transistor of the third differential transistor pair.

14. A supply-sensing amplifier with a folded-cascode output, the supply-sensing amplifier comprising:
- a first differential transistor pair configured to receive a differential input signal at respective input nodes and in response conduct a differential first current to a cascode-protected output node;
- a second differential transistor pair configured to receive information about the differential input signal;
- a third differential transistor pair configured to receive information about the differential input signal; and
- a cascode output including first and second cascode transistors, and each of the first and second cascode transistors is configured to receive a cascode control signal, wherein the cascode control signal corresponds to a magnitude of the differential input signal and is based on signals conducted by a first transistor from the second differential transistor pair and by a first transistor from the third differential transistor pair.

15. The supply-sensing amplifier of claim 14, wherein the second differential pair comprises transistor devices with unbalanced effective area characteristics, and wherein the third differential pair comprises transistor devices with unbalanced effective area characteristics.

16. The supply-sensing amplifier of claim 14, further comprising a slew boost circuit configured to receive a slew control signal that is based on signals conducted by a second transistor from the second differential transistor pair and by a second transistor from the third differential transistor pair, and
- wherein the slew boost circuit is configured to source or sink current at the cascode-protected output node based on the slew control signal.

17. The supply-sensing amplifier of claim 14, wherein the cascode control signal is independent of a transconductance of the first differential transistor pair.

18. A method for amplifying a differential input signal using an amplifier circuit, the amplifier circuit capable of amplifying input signals having a component that can extend to at least one power supply rail of the amplifier circuit, the method comprising:
- receiving the differential input signal at a first differential transistor pair and, in response, providing a differential first current to a cascode output stage of the amplifier circuit;
- generating a cascode control signal based on a magnitude of the differential input signal, wherein the cascode control signal is independent of a transconductance of the first differential transistor pair;
- providing the cascode control signal to each of multiple different transistors in the cascode output stage of the amplifier circuit, including an output cascode transistor coupled to an output node of the cascode output stage; and
- providing an output signal from the output node of the cascode output stage based on the magnitude of the differential first current and the cascode control signal.

19. The method of claim 18, further comprising:
- generating a slew boost control signal based on the differential input signal; and
- sinking or supplying current at the output node of the cascode stage based on the differential input signal.

20. The method of claim 19, further comprising receiving the differential input signal at second and third differential transistor pairs;
- wherein the generating the cascode control signal includes using a combined signal from first legs of the second and third differential transistor pairs; and
- wherein the generating the slew boost control signal includes using signals from other legs of the second and third differential transistor pairs.

* * * * *